United States Patent [19]
Terao et al.

[11] Patent Number: 5,677,743
[45] Date of Patent: Oct. 14, 1997

[54] APPARATUS AND METHOD FOR SYNCHRONIZING A HORIZONTAL DEFLECTION SIGNAL WITH A HORIZONTAL SYNC SIGNAL

[75] Inventors: Chojiro Terao, Amagasaki; Ko Nishino, Nagaokakyo, both of Japan

[73] Assignee: Mitsubishi Denki Kabushiki Kaisha, Tokyo, Japan

[21] Appl. No.: 726,351

[22] Filed: Oct. 4, 1996

Related U.S. Application Data

[62] Division of Ser. No. 502,553, Jul. 14, 1995.

[30] Foreign Application Priority Data

Jul. 14, 1994 [JP] Japan ................................. 6-162297

[51] Int. Cl.$^6$ ........................................... H04N 5/50
[52] U.S. Cl. ......................... 348/735; 348/536; 348/540
[58] Field of Search ................................. 348/536, 537, 348/540, 735; 358/158, 195.1; 455/173.1, 182.2, 192.2; 331/20; H04N 5/50

[56] References Cited

U.S. PATENT DOCUMENTS 3,990,107 11/1976 Hanma.
5,181,116 1/1993 Nakagaki.

Primary Examiner—Sherrie Hsia

[57] ABSTRACT

In an automatic frequency control circuit for synchronizing a horizontal deflection current of a television receiver with a horizontal sync signal, a bi-level signal which assumes either of two levels when the flyback pulse is or below a threshold value is produced, and a wider sync signal in synchronism with the horizontal sync signal and having a pulse width wider than the horizontal sync signal and equal to an odd multiple of the operating clock period is also produced. A phase comparator detects the difference in the number clock periods between a period period from a leading edge of the wider sync signal to an edge of the bi-level signal, and a period from the edge of the bi-level signal to a trailing edge of the wider sync signal. The detected difference is used to control a VCO. In an alternative configuration, a digital signal indicative of a magnitude of the flyback pulse during its rising or falling slope at an edge of the horizontal sync signal is produced and used for control of the VCO.

8 Claims, 17 Drawing Sheets

APPARATUS AND METHOD FOR SYNCHRONIZING A HORIZONTAL DEFLECTION SIGNAL WITH A HORIZONTAL SYNC SIGNAL

This application is a divisional of copending application Ser. No. 08/502,553, filed on Jul. 14, 1995, the entire contents of which are hereby incorporated by reference.

BACKGROUND OF THE INVENTION

This invention relates to an automatic frequency control circuit for synchronizing the horizontal deflection current in a television receiver with the horizontal synchronous signal contained in a video signal, such as a broadcast color television signal or a video signal from a video tape recorder.

Conventional automatic frequency control (AFC) circuit includes a voltage-controlled oscillator (VCO) whose frequency is controlled in accordance with a phase error of a flyback pulse (FBP) generated from the horizontal deflection current, with respect to the horizontal sync: signal (HSYNC) signal. When the AFC circuit is formed of digital circuits, the phase error is detected with a resolution of the operating clock period. That is, the phase error smaller than the operating clock period could not be detected or corrected.

One way of increasing the accuracy of the phase error detection is to increase the frequency of the operating clock. However, to attain an accuracy adequate for horizontal synchronization in a television receiver, the frequency of the oscillating clock needs to be extremely high, and producing such a high frequency is practically impossible.

Another problem relates to compromise between the response and stability. To increase the response (promptness) in eliminating the phase error, the time constant of an integrator included in the AFC circuit may be reduced. This however lowers the stability, and the AFC circuit is susceptible to jitter or noises, and the stability of the displayed image is lowered.

SUMMARY OF THE INVENTION

This invention was devised to overcome the problems described above, and its primary object is to provide an AFC circuit that can control the phase and frequency of the horizontal deflection current with an accuracy adequate for horizontal synchronization in a television receiver, using an operating clock with a frequency which is not so high, i.e., is in the practicable range.

Another object of this invention is to provide an AFC circuit with adequately quick response and satisfactory stability.

According to one aspect of the invention, there is provided an automatic frequency control circuit for synchronizing a horizontal deflection current of a television receiver with a horizontal sync signal, with a flyback pulse being produced in synchronism with said horizontal deflection current, said automatic frequency control circuit comprising a voltage-controlled oscillator for producing clock pulses;

a frequency divider for frequency-dividing the output of said voltage-controlled oscillator;

said horizontal deflection current being produced in accordance with the output of said frequency divider;

means responsive to the flyback pulse for producing a bi-level signal which assumes either of two levels when the flyback pulse is or is not above a threshold value;

a wider sync signal generator responsive to a horizontal sync signal for producing a wider sync signal in synchronism with the horizontal sync signal and having a pulse width wider than the horizontal sync signal and equal to an odd multiple of the operating clock period;

a phase comparator responsive to said wider sync signal and said bi-level signal, and producing phase error data by detecting the difference in the number clock periods between a first period period from a leading edge of said wider sync signal to an edge of said bi-level signal, and a second period from said edge of said bi-level signal to a trailing edge of said wider sync signal; and means responsive to the output of the phase comparator for producing said voltage signal used for controlling the oscillating frequency of said voltage-controlled oscillator.

With the above arrangement, the phase error can be detected with a resolution finer than the clock period, so that the phase of the FBP can be controlled accurately.

In a steady state, the phase difference at the output of the subtractor will be an alternation between 1 and −1. The actual phase error of the FBP can be maintained smaller than one clock period. The oscillation depends on the rate of change of the output frequency with respect to VCO control voltage and the time constant of the integrator. Thus when the rate of change is small, the oscillation becomes small, and even if the time constant is large, it is possible to reduce oscillation. Moreover, the size of the digitized horizontal AFC circuit can be reduced.

The automatic frequency control circuit may additionally be provided with:

a differentiator for determining the differential value of said phase error data; and an adding means for adding a first signal produced from said the phase error and a second signal produced from the differential value, to produce said voltage signal to be applied to said voltage-controlled oscillator.

As the contribution of the differential data to the variation of the oscillating frequency is identical when the sign of the phase error is unchanged (i.e., when the phase error is relatively large), the phase error is reduced more quickly (than if the differentiator is not used). When the sign of the phase error is alternating (i.e., when the phase error is small and oscillating about zero, the effect of the differential value on oscillating frequency is opposite to the effect of the phase error, so that the addition of the differential value improves the stability of control.

The above-mentioned means for producing said voltage signal may comprise:

a digital data-to-pulse width converter for receiving the phase error data and producing, during each horizontal period, a signal having a pulse which is high or low depending on the sign of the phase data, and having a pulse width corresponding to the magnitude of the phase error data, the output of said digital data-to-pulse width converter being of a high-impedance state for the rest of the horizontal period; and an integrator for integrating the output of said D/A converter to produce said voltage signal.

With the above arrangement, the D/A converters can be eliminated. Accordingly, the size and cost of the AFC circuit can be further reduced.

According to another aspect of the invention, there is provided an automatic frequency control circuit for synchronizing a horizontal deflection current of a television receiver with a horizontal sync signal, with a flyback pulse being produced in synchronism with said horizontal deflection current, said automatic frequency control circuit comprising a voltage-controlled oscillator for producing clock pulses;

a frequency divider for frequency-dividing the output of said voltage-controlled oscillator;

said horizontal sync current being produced in accordance with the output of said frequency divider;

digital signal producing means for producing first digital data indicative of a magnitude of the flyback pulse during its rising or falling slope at an edge of the horizontal sync signal;

a first integrator integrating said first phase data to produce a first integrated phase data;

a complement-to-positive number converter for converting an output of said first integrator to produce a digital signal representing a positive number corresponding to said first integrated phase data; and a D/A converter for converting the digital signal from said complement-to-positive number converter into a corresponding first integrated phase error voltage signal;

a frequency of said clock pulses produced by said voltage-controlled oscillator being controlled in accordance with said first integrated phase error voltage signal.

With the above arrangement, the phase error can be detected at a resolution finer than the clock period.

It may be so arrangement that said frequency divider comprises a variable frequency divider having a variable frequency division factor; and said automatic frequency control circuit further comprises a frequency division factor control means for varying the frequency division factor in accordance with the phase error of the flyback pulse with respect to the horizontal sync signal.

With the above arrangement, when the phase error is relatively large, the frequency division factor is varied, so that the relatively large phase error can be quickly eliminated. That is, the response in the phase control is improved. When the phase error is relatively small, the phase and frequency is controlled by means of the VCO. Accordingly, the adequate stability is ensured.

The frequency division factor control means may comprise:

a horizontal sync period counter for counting clock pulses for a horizontal sync period;

a second integrator for integrating the count of the horizontal sync counter to produce an integrated count data;

means responsive to the flyback pulse for producing a bi-level signal which assumes either of two when the flyback pulse is or is not above a threshold value;

a second phase comparator for detecting a phase difference between said HSYNC signal and said bi-level signal to produce second phase data;

a coefficient multiplier multiplying the second phase data by a coefficient of which is not larger than unity and larger than zero;

an adder adding the output of the coefficient multiplier to the output said second integrator;

a mode selector selecting a "Narrow" mode when the second phase data is smaller than a certain threshold value, and a "Wide" mode when the second phase data is larger than the certain threshold;

a selector selecting the output of the second integrator when the mode selector selects the "Narrow" mode, and the selects the output of the adder when the mode selector selects the "Wide" mode, and outputting the selected signal as a frequency division control signal to the variable frequency divider.

It may be so arranged that said variable frequency divider is resettable responsive to a reset pulse externally supplied;

said frequency division factor control means further comprises a second counter for counting the clock pulses during a period of from a horizontal deflection trigger pulse to an edge of said bi-level signal to thereby measure a FBP delay time;

a reset pulse generator for applying said reset pulse to said variable frequency divider immediately after an end of a vertical blanking period, if said second phase data is larger than a second threshold larger than said certain threshold.

With the above arrangement, when the phase error is above the second threshold larger that the first mentioned threshold, the variable frequency divider is reset, so that the phase of the trigger pulse supplied from the variable frequency divider to the horizontal deflection circuit is quickly adjusted after a vertical blanking period. The response of the AFC circuit to an extremely large error is thereby improved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Following is an explanation of the preferred embodiments of this invention, with reference to the attached drawings.

First Embodiment

Figure 1:
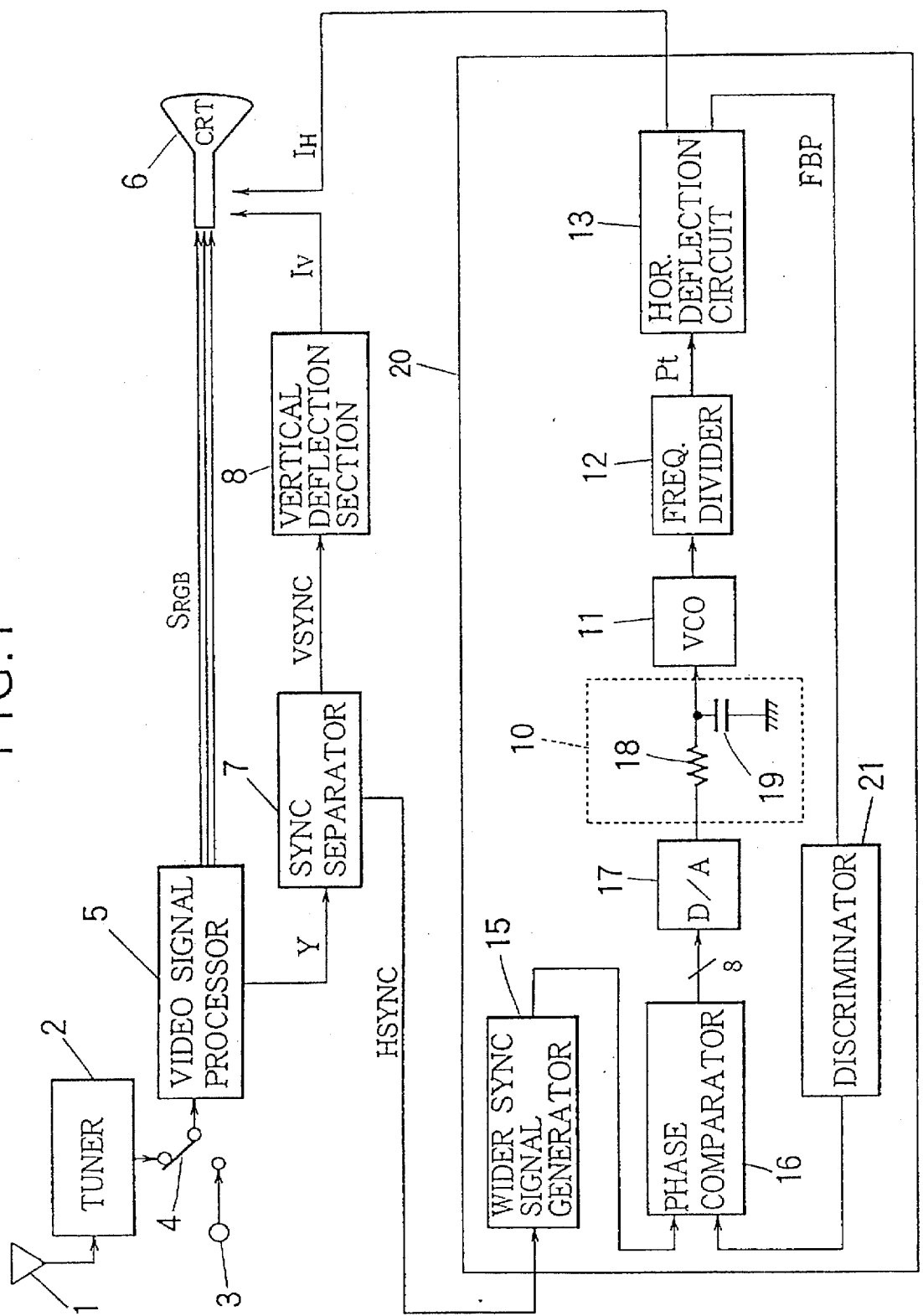
FIG. 1 is a block diagram showing the digital horizontal AFC circuit of a first embodiment of this invention.

FIG. 1 is a block diagram showing pertinent portions of a television receiver including a horizontal AFC circuit according a first embodiment of this invention.

The illustrated television receiver is connected to an antenna 1, and comprises a tuner 2, an external terminal 3, an AV selector 4, a video signal processor 5, a CRT 6, a sync separator 7, and a vertical deflection section 8.

The AV selector 4 selects either a video signal received by the antenna 1 and input via the tuner 2, or a video signal input from a VTR (not shown) or other external device, via the external input terminal 3. The selected signal is supplied to the video signal processor 5, which performs Y/C separation, color demodulation, RGB matrix and other processing. The resultant primary RGB color signals are supplied to the CRT 6. A luminance signal Y which is also produced in the video signal processor is supplied to the sync separator 7.

The sync separator 7 separates a vertical sync (VSYNC) signal and a horizontal sync (HSYNC) signal, the latter having a frequency of, for example, 15.75 kHz. The VSYNC is supplied to the vertical deflection section 8, which, based on the VSYNC signal, generates a vertical deflection current $I_V$. The HSYNC signal is supplied to a horizontal AFC circuit 20, which generates a horizontal deflection current $I_H$. The vertical and horizontal deflection currents are supplied to the CRT 6 for scanning the electron beam across the CRT screen.

The AFC circuit 20 comprises a wider sync signal generator 15, a phase comparator 16, a D/A converter 17, an integrator 10, a VCO 11, a frequency divider 12, a horizontal deflection circuit 13 and a discriminator 21.

An FBP signal is generated by the flyback transformer in the horizontal deflection circuit 13 in synchronism with the horizontal deflection current.

The discriminator 21 produces a bi-level signal which assumes one of two levels (e.g., High level) when the FBP signal is above a certain threshold, and the other level (e.g., Low level) when the FBP signal is below the certain threshold.

The HSYNC signal from the sync separator 7 has a short pulse duration (a low-level width) of, for example, 5.08 μs, and a high rate of repetition of 15.75 kHz.

The wider sync signal generator 15 receives the HSYNC signal from the sync separator 7, and produces a wider sync (WSY) signal in synchronism with the HSYNC signal, and having a pulse width (also called a WSY pulse period) which is wider than the pulse width of the HSYNC signal, and is an odd multiple of (e.g., 11 times) the operating clock period.

The phase comparator 16 receives the WSY signal from the wider sync signal generator 15, and the bi-level FBP signal, compares the phase of the hi-level FBP signal with the phase of the WSY signal, and outputs digital phase error signal of eight bits, for example, indicative of the phase error of the FBP signal with respect to the WSY signal. This will be described in further detail later.

The D/A converter 17 receives the digital phase error signal from the phase comparator 16, and produces a corresponding analog voltage signal.

The integrator 10 comprising a resistor 18 and a capacitor 19 integrates or smoothes the error voltage signal from the D/A converter 17, and the smoothed voltage signal is applied to the VCO 11, as a control voltage. The oscillation frequency of the VCO 11 is controlled according to the control voltage, and the resultant VCO clock signal is supplied to the frequency divider 12. The frequency divider 12 divides the frequency of the output of the VCO 11, to produce driver or trigger pulses Pt. Responsive to the trigger pulses Pt, the horizontal deflection circuit 13 generates the horizontal deflection current $I_H$. In this way, the horizontal deflection current $I_H$ in synchronism with the HSYNC signal is generated and supplied to the CRT 6.

Figure 2:
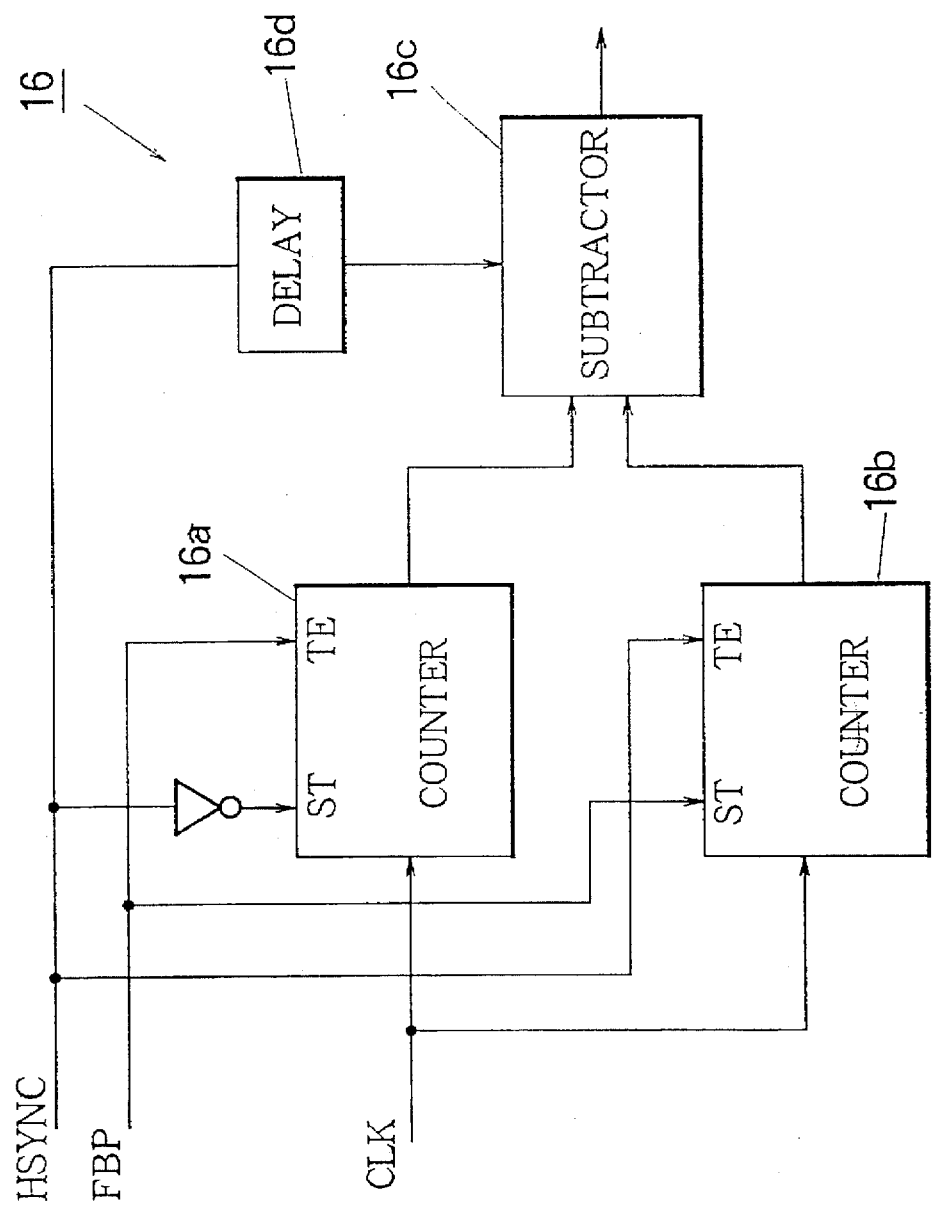
FIG. 2 is a block diagram showing an example of phase comparator 16 in FIG. 1.

Referring to FIG. 2, the phase comparator 16 comprises a first counter 16a that counts the number of clock pulses (A) occurring from the leading or falling edge of the WSY signal to the rising edge of bi-level FBP signal, and a second counter 16b that counts the number of clock pulses (B) occurring from the the rising edge of the bi-level FBP signal to the trailing or rising edge of the WSY signal. The count value of each of the counters 16a and 16b is incremented at the rising edges of the clock pulses. The phase comparator 16 further comprises a subtractor 16c finding the difference P=(A−B) between the count values A and B of the counters 16a and 16b. That is, the subtractor 16c performs the subtraction (A−B) a little after the rising edge of the WSY signal. For this purpose, a delay circuit 16d delays the rising edge of the WSY signal, and supplies the delayed signal to the subtractor 16c, which thereupon conducts the subtraction. The difference P=(A−B) is used as a signal representing the phase error. Where the phase error P is represented by eight-bit complement data, the digital value obtained by conversion into a positive number is output as the digital phase error signal.

The D/A converter 17 converts the 8-bit phase error signal from the phase comparator 16 into a corresponding analog error voltage signal that varies in a range of, for example, 0V to 5V. This error voltage signal is smoothed by integrator 10, and the integrated error voltage is input to VCO 11 as the VCO control voltage.

In accordance with the integrated error voltage, the VCO 11 is controlled, and the phase and frequency of the deflection current is controlled as described above. The FBP signal, and hence the bi-level FBP signal indicative of the phase of the deflection current are therefore produced.

Figure 3:
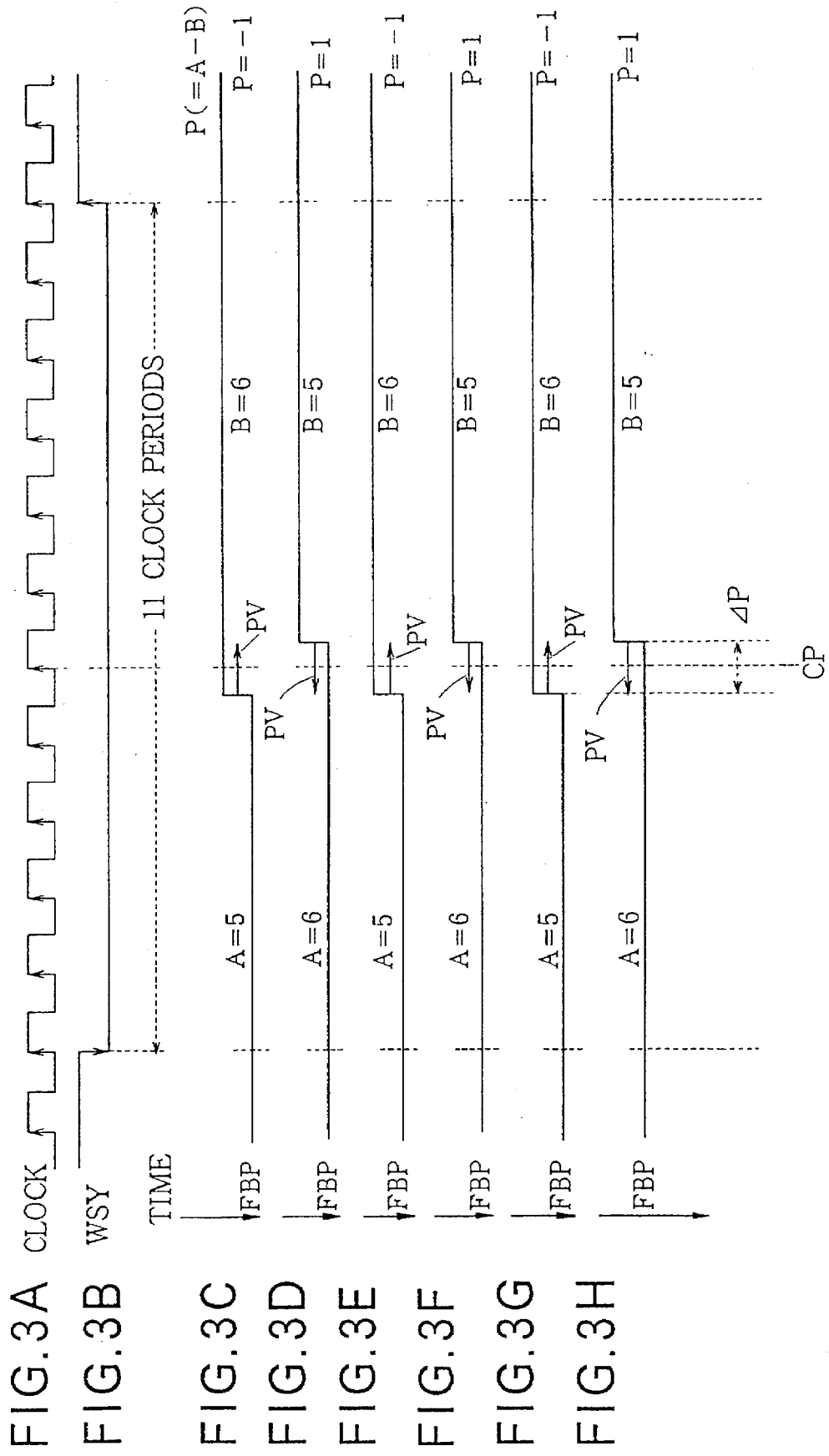
FIG. 3A to FIG. 3H are waveform diagrams showing changes in FBP phase at steady state.

FIG. 3A to FIG. 3H are waveform diagrams showing changes in FBP phase when the horizontal AFC circuit 20 is in a steady state. The VCO 11 outputs a CLOCK signal as shown in FIG. 3A which has a frequency that is practicable in an ordinary television receiver.

If the horizontal deflection current is lagging in phase, and the bi-level FBP signal rises after the rising edge of the sixth clock pulse in the WSY pulse period (in which the WSY signal is low), as shown for example at FIG. 3C, the output of the phase comparator 16 will be a negative value. The control over the VCO 11 is then so made that the frequency or phase of the VCO 11 is advanced. As a result, during subsequent horizontal scanning periods, the rising edge of the FBP is advanced, as indicated at FIG. 3D.

If the FBP is leading in phase, and the bi-level FBP rises before the rising edge of the sixth clock pulse in the WSY pulse period, as shown for example at FIG. 3D, the control over the VCO 11 is then so made that the frequency or phase of the VCO 11 is retarded. As a result, during subsequent horizontal scanning periods, the rising edge of the FBP is retarded, as indicated at FIG. 3E.

By repetition of such operations as shown in FIGS. 3F and 3G, the rising edge of the bi-level FBP is substantially converged to the rising edge of the sixth clock pulse in the WSY pulse period, although there is some oscillation around the converging point CP even in a steady state, as will be described next.

In FIG. 3A to FIG. 3H, the phase of the bi-level FBP changes with a certain amplitude, centered on convergent point CP of the WSY pulse period, as indicated at FIG. 3C to FIG. 3H, with the WSY pulses having a frequency of 15.75 kHz. Since the duration of the low level of the WSY signal output from the wider sync signal generator 15 is set to be an odd multiple of, such as 11 times as shown in FIG. 3B, the clock period, the phase difference P, which is calculated as a difference in clock pulse count (=A−B), can never be zero. For this reason, even when in a steady state, a lag or a lead is detected and a corresponding error signal is output. When the response is quick, the phase difference P will alternate between 1, −1, 1, −1, 1, −1 . . . . The arrows labeled PV indicate the direction in which the rising edge of the bi-level FBP is altered (advanced or retarded) by the action of the VCO 11.

This means that, even in a steady state, the rising edge of the bi-level FBP oscillates around the convergent point CP. The amplitude ΔP of oscillation in the steady state depends on the rate of change of the output frequency or phase with respect to VCO control voltage and on the time constant of the integrator 10. If the rate of change is lowered or the time constant of the integrator is increased, the amplitude ΔP will decrease, so that control of phase and frequency can be accomplished with a resolution higher than one clock pulse period.

The above resolution higher than the one clock pulse period is achieved by setting the WSY pulse period to be an odd multiple of clock pulse period. If the WSY pulse period were an even multiple of clock pulse period, then as long as the deviation of the rising edge of the bi-level FBP is not larger than one clock period, the difference (A−B) would be zero, and no action would be taken to correct the frequency or phase of VCO 11. That is, the resolution for error detection would be 1 clock pulse period, and accurate control over the FBP frequency and phase would not be achieved.

Second Embodiment

Figure 4:
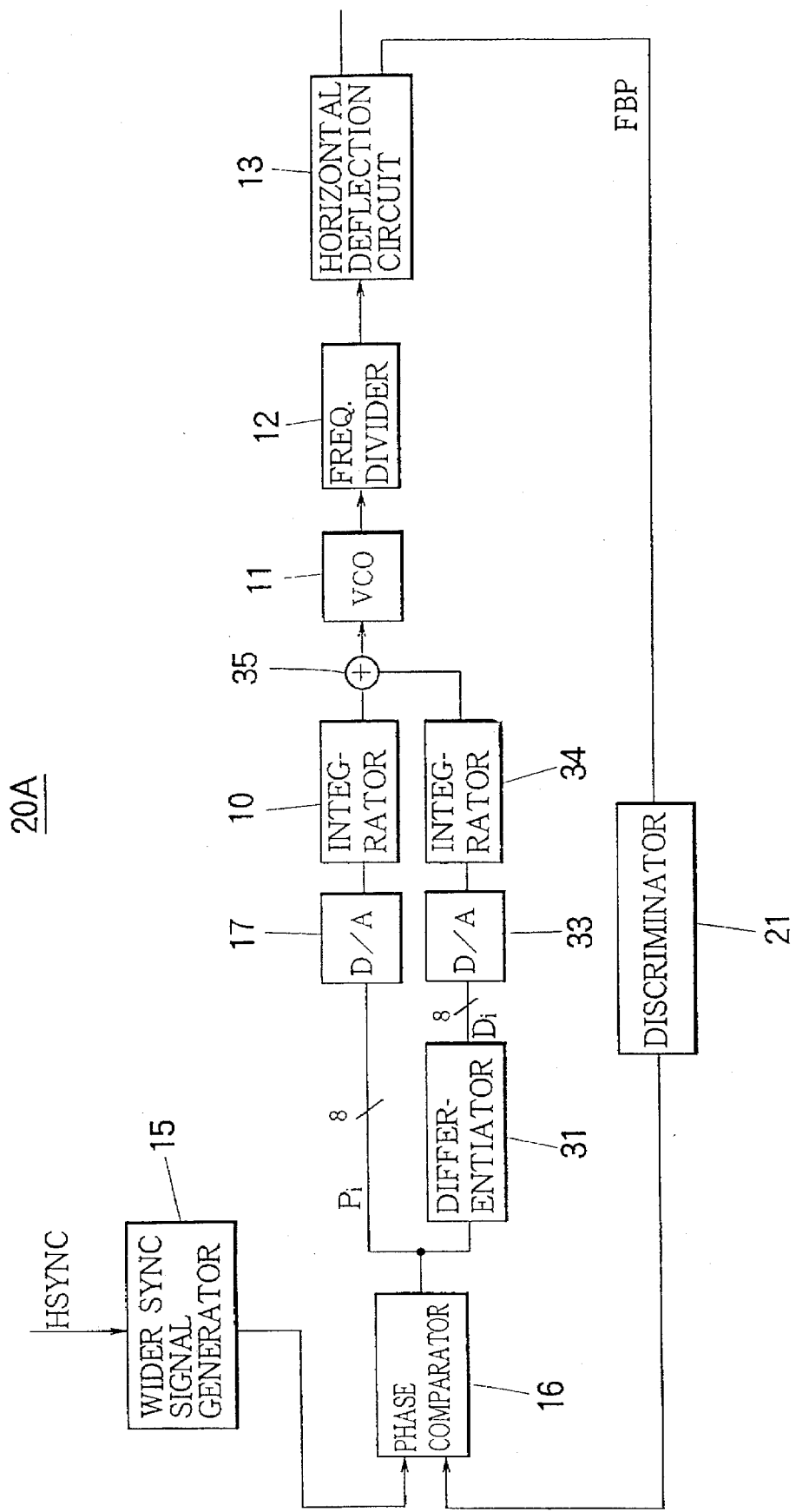
FIG. 4 is a block diagram showing the digital horizontal AFC circuit of a second embodiment of this invention.

FIG. 4 is a block diagram showing a horizontal AFC circuit according a second embodiment of this invention. The illustrated horizontal AFC circuit 20A is similar to the AFC circuit 20 shown in FIG. 1. But a differentiator 31, an additional D/A converter 33, an additional integrator 34, and an adder 35 are additionally provided.

The output of the phase comparator 16 is now labeled Pi to clarify that it represents the phase difference having just been calculated, or currently calculated. The differentiator 31 determines the differential value Di which is a difference (Pi−P(i−1)) between Pi and P(i−1), the latter representing the phase error determined previously, i.e., one horizontal period before.

Figure 5:
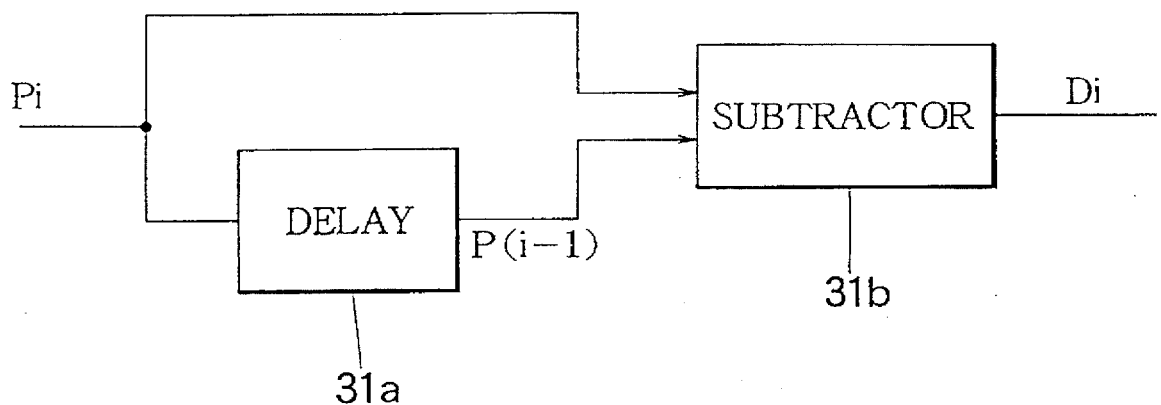
FIG. 5 is a block diagram showing an example of differentiator 31 in FIG. 4.

The differentiator 31 may comprise, as shown in FIG. 5, a delay circuit 31a and a subtractor 31b. The delay circuit 31 delays the phase error Pi by one horizontal period, to produce the previous phase error P(i−1). The subtractor 31b determines the differential value Di={Pi−P(i−1)} between Pi and P(i−1). The calculation at the subtractor 31b is effected a little after the calculation at the subtractor 16c in the phase comparator 16 is effected, i.e., when a new value of the phase error is established. The delay circuit 31a may comprises a register which reads the output of the phase comparator 31a at a timing after the calculation at the subtractor 31b and before the calculation at the subtractor 16c in the succeeding horizontal period.

The differentiator 31 may also be so formed that the differential value Di output therefrom is expressed by eight bit data. The D/A converter 33 converts the digital data Di into a corresponding analog signal, within the range of 0 to 5 V, for example.

The integrator 34 smoothes or integrates the output of the D/A converter 33. The adder 35 adds the outputs of the integrators 10 and 34.

Figure 6:
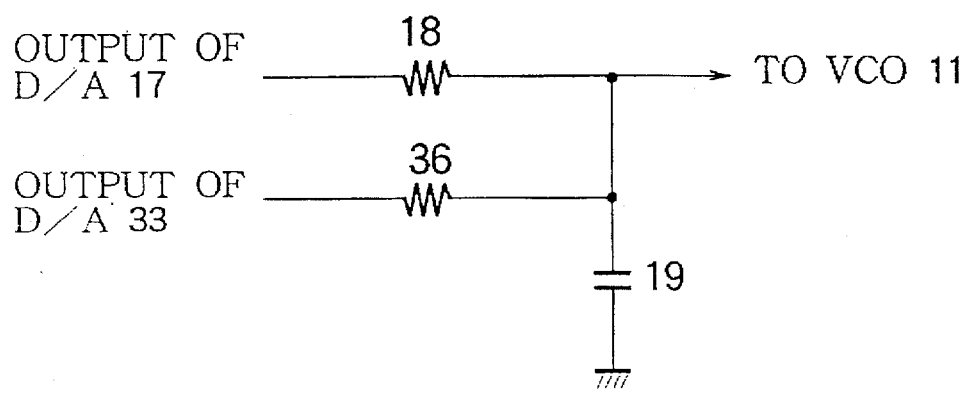
FIG. 6 is a circuit diagram showing an example of combined integrator/adder in FIG. 4.

The combination of the integrators 10 and 34, and the adder 35 can be formed of a circuit shown in FIG. 6. The illustrated circuit comprises a resistor 18 and capacitor 19 similar to those in FIG. 1, and an additional resistor having one end connected to the output of the D/A converter 33 and having the other end connected to the junction between the resistor 18 and the capacitor 19. The resistance 36 is set to be three times the resistance of the resistor 18. An effect is that the result of the phase error detection is given a greater weight than the result of the differential value, the ratio between the weighting factors being three to one.

Figure 7:
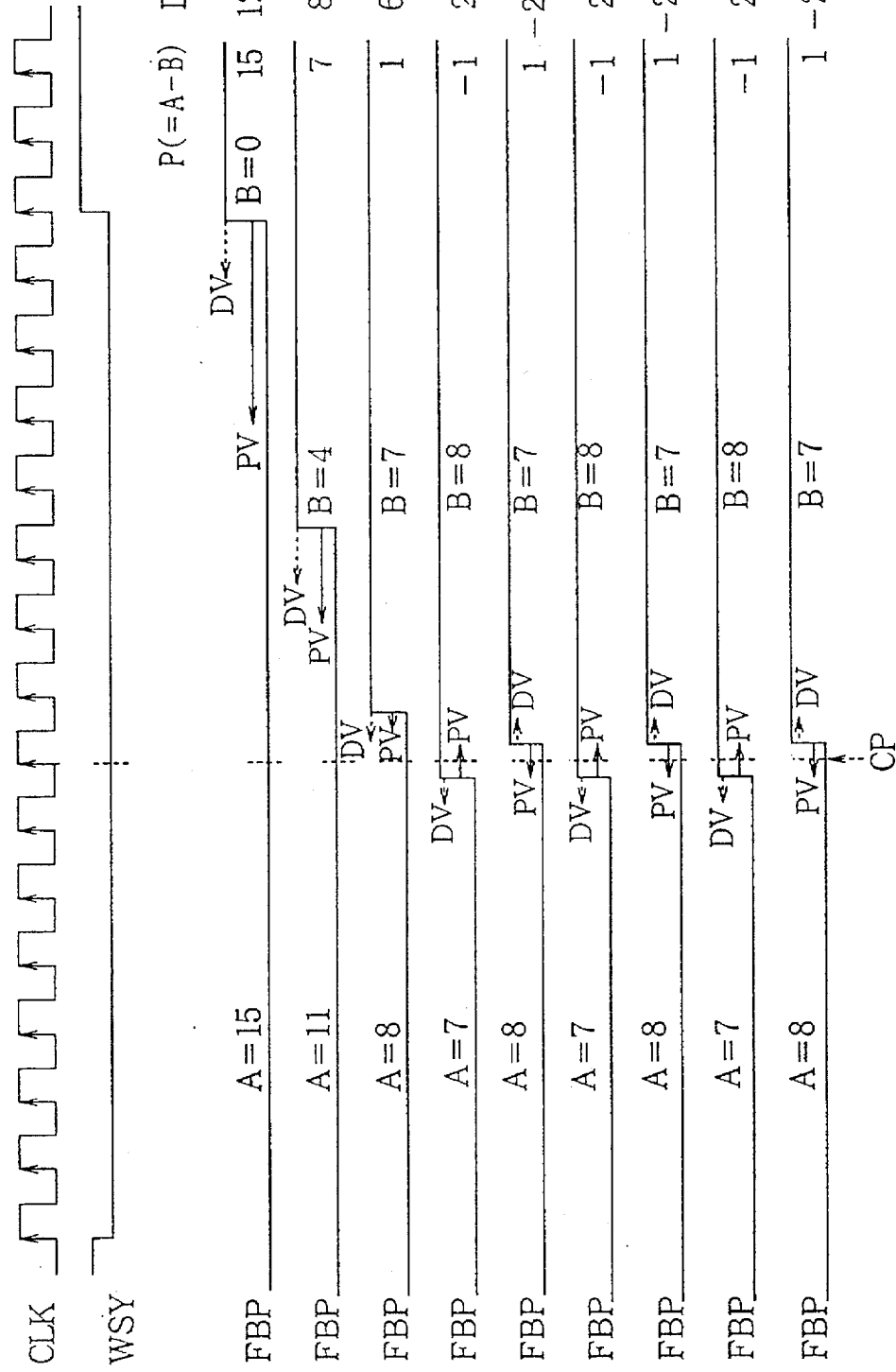
FIG. 7A to FIG. 7K are waveform diagrams showing the clock, bi-level FBP signal, and the HSYNC signal.

FIG. 7A to FIG. 7K are waveform diagrams showing changes in the bi-level FBP when horizontal AFC circuit 20A is in transition from the following operation (in which the phase error is initially large and the circuit is rapidly reducing the error) to steady state (in which the phase error is minimum, i.e., near the resolution of measurement). In the present embodiment, the pulse width (low-level period) of the WSY signal from the wider sync signal generator 15 is fifteen times the clock pulse period as shown in FIGS. 7A and 7B, so that the converging point CP is the rising edge of the eighth clock pulse within the WSY period.

The frequency or phase of the VCO 11 is controlled in accordance with the sum of the phase error P and the differential value Di. The tendencies of the respective contributions of the phase error Pi and the differential value D in changing the phase of the FBP are shown by arrows PV (for phase error) and DV (for differential value). When the phase error Pi is negative, as in FIG. 7C and FIG. 7D, FIG. 7G, FIG. 7I, and FIG. 7K, it tends to increase the frequency of the VCO output and to thereby advance the phase of the VCO output, as indicated by arrows PV. When the phase error Pi is positive, as shown in FIG. 7F, FIG. 7H, and FIG. 7J, it tends to decrease the frequency of the VCO output, and to thereby retard the phase of the VCO output, as indicated by arrows PV.

When the differential value D is positive (i.e., Pi>P(i−1)), meaning the phase error is changing toward the positive infinity (less negative or more positive) as shown in FIG. 7D, FIG. 7E, FIG. 7F, FIG. 7H and FIG. 7J, it tends to increase the frequency of the VCO output and to thereby advance the phase of the VCO output, as indicated by arrows DV. When the differential value D is negative (i.e., Pi<P(i−1), meaning the phase error is changing toward the negative infinity (less positive or more negative), as shown in FIG.

7G, FIG. 7I, and FIG. 7K, it tends to decrease the frequency of the VCO output and to thereby retard the phase of the VCO output, as indicated by arrows DV.

Thus, the differential value D serves to accelerate the reduction of the phase error when the phase error is being reduced. Accordingly, the response of the control is high. When the phase error is oscillating about zero, the influence of the differential value D on the VCO output partially cancel the influence of the phase error on the VCO output, and tends to restrain the amplitude of oscillation. The two-fold effect is optimized by appropriately setting the weighting factors for the differential value and the phase error, and the sufficient stability in the steady is thereby secured.

Third Embodiment

Figure 8:
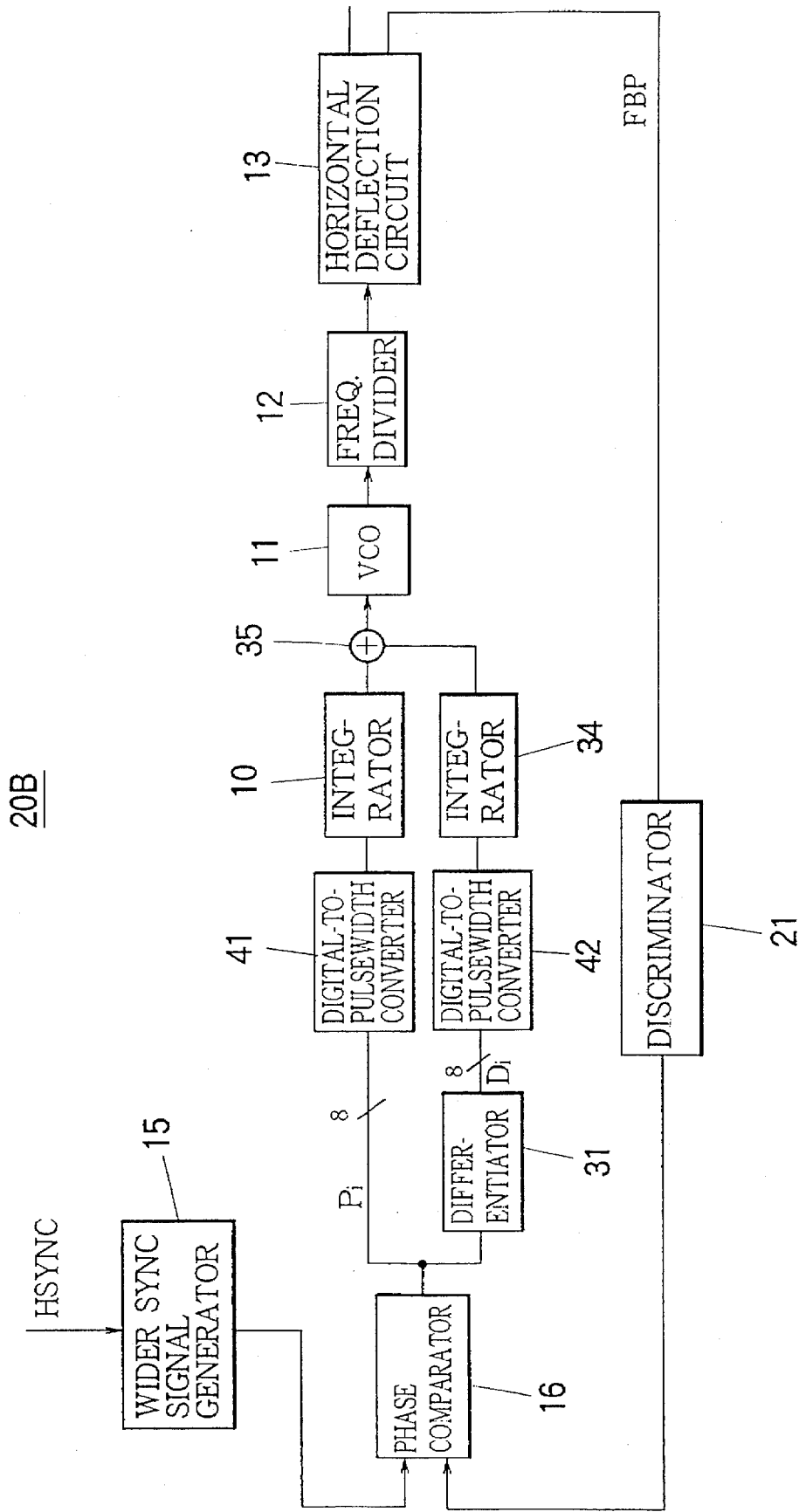
FIG. 8 is a block diagram showing the digital horizontal AFC circuit of a third embodiment of this invention.

FIG. 8 is a block diagram showing pertinent parts of a horizontal AFC circuit according a third embodiment of this invention. The horizontal AFC circuit 20B of this embodiment is similar to the the horizontal AFC circuit 20A shown in FIG. 4. But instead of the D/A converters 17 and 33, voltage converters 41 and 42 are provided.

In each of the horizontal period, the output of the voltage converter 41 is kept high or low for a period corresponding the value of the phase error, and is at a high-impedance state for the rest of the horizontal period. That is, if the phase error is a positive value P, the output of the voltage converter 41 is maintained high for a period P times the clock pulse period, and is at the high-impedance state for the rest of the horizontal period. If the phase error is a negative value P, the output of the voltage converter 41 is maintained low for a period |P| times the clock pulse period, and is at the high-impedance state for the rest of the horizontal period.

Similarly, in each of the horizontal period, the output of the voltage converter 42 is kept high or low for a period corresponding the value of the differential value, and is at the high-impedance state for the rest of the time. That is, if the differential value is a positive value D, the output of the voltage converter 42 is maintained high for a period D times the clock pulse period, and is at the high-impedance state for the rest of the horizontal period. If the differential value is a negative value D, the output of the voltage converter 42 is maintained low for a period |D| times the clock pulse period, and is at the high-impedance state for the rest of the horizontal period.

The phase error P output from the phase comparator 16 and the differential value D output from the differentiator 31 are both represented in the form of complement.

The outputs of the voltage converters 41 and 42 are supplied to the integrators 10 and 34, where they are integrated and smoothed.

The outputs of the integrators 10 and 34 will be analog values corresponding to the phase error P and the differential value D, or the output of the adder 35 will the sum of the phase error P and the differential value D, multiplied with respective weighting factors.

According to this embodiment, the D/A converters are not required, so that the size and the cost of the AFC circuit can be reduced, and yet effects similar to the second embodiment can be attained.

Fourth Embodiment

Figure 9:
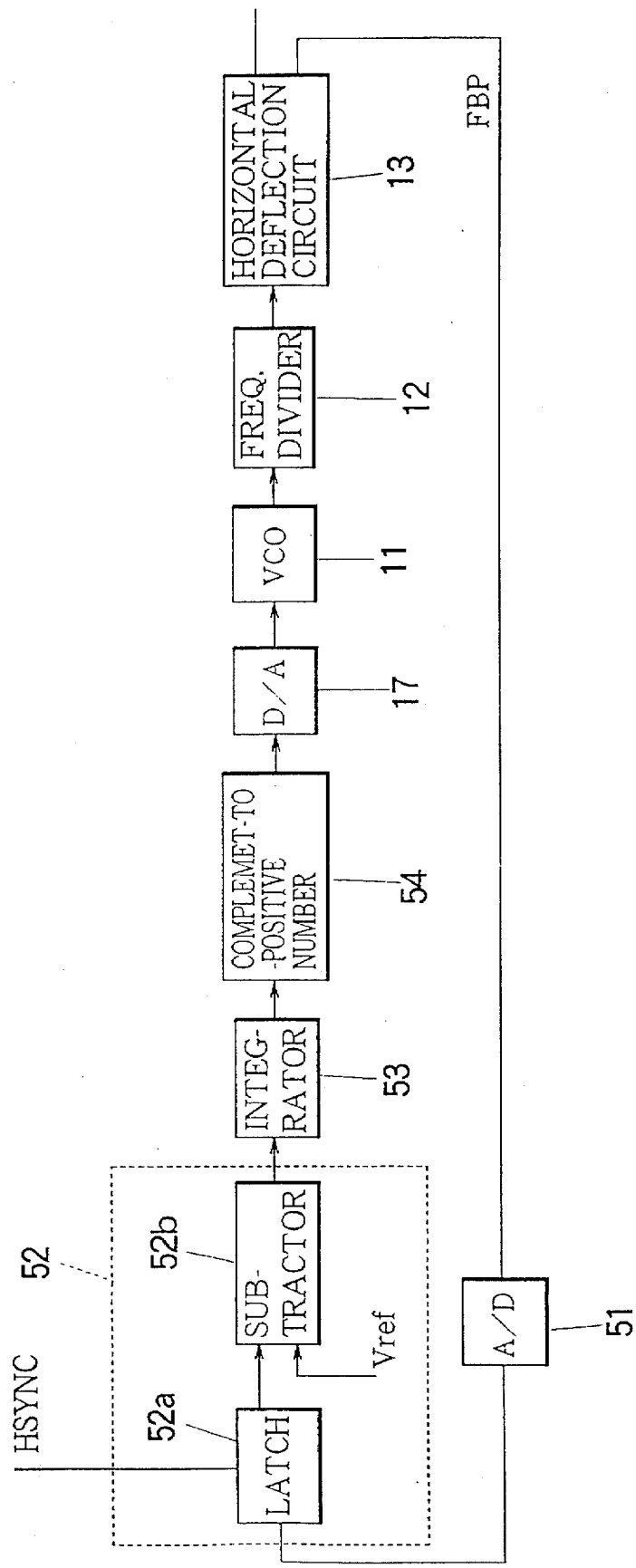
FIG. 9 is a block diagram showing the digital horizontal AFC circuit of a fourth embodiment of this invention.

FIG. 9 is a block diagram showing the digital horizontal AFC circuit according to a fourth embodiment. The illustrated AFC circuit 20C is similar to the AFC circuit 20 in FIG. 1. However, the phase comparator 16 in FIG. 1 is replaced by a phase comparator 52 of a different configuration, and an A/D converter 51 is provided. The wider sync signal generator 15 and the integrator 10 are eliminated, and the HSYNC is input directly to the phase comparator 48. An integrator 53 in the form of a low-pass digital filter and a complement-to-positive number converter 54 are inserted between the phase comparator 16 and the D/A converter 17. The integrator 10 in FIG. 1 is omitted, and the output of the D/A converter 17 is directly input to the VCO 11.

The A/D converter 51 periodically converts the FBP from the horizontal deflection circuit 18, at the clock period, e.g., at falling edges of the clock pulses.

As illustrated, the phase comparator 52 comprises a latch circuit 52a which latches the output of the A/D converter 51 at the rising edge of the HSYNC, and a subtractor 52b subtracting a reference value Vref (e.g., 127) from the output Po of the latch circuit 52a to produce the difference (Po−Vref).

The digital data is represented by eight bits, or by a value of 256 gray scale levels.

The value obtained by latching the output of the A/D converter 51 at the rising edge of the HSYNC represents the phase error of the FBP with respect to the HSYNC. This will be explained later.

The integrator 53 eliminates the high-frequency component in the phase error data from the phase comparator 48.

The complement-to-positive number converter 54 converts complement data representing the phase error into corresponding positive number data. This can be implemented by inverting the most significant bit (MSB) of the complement data. The D/A converter 55 converts the phase error signal from the complement-to-positive number converter 54, into a corresponding analog signal. The output of the D/A converter 17 is supplied as a control signal to the VCO 11.

Figure 10A:
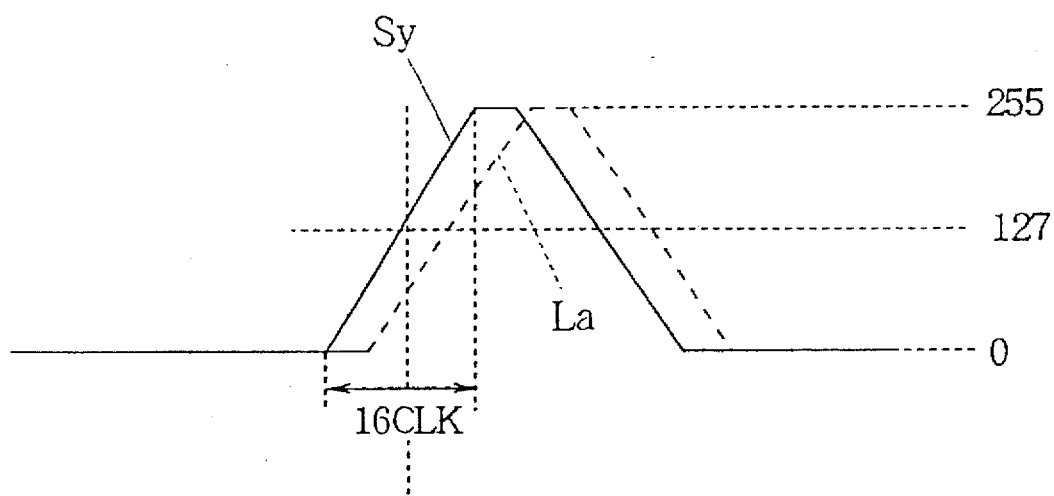
FIG. 10A and FIG. 10B are waveform diagrams showing an FBP signal and the HSYNC signal.
Figure 10B:
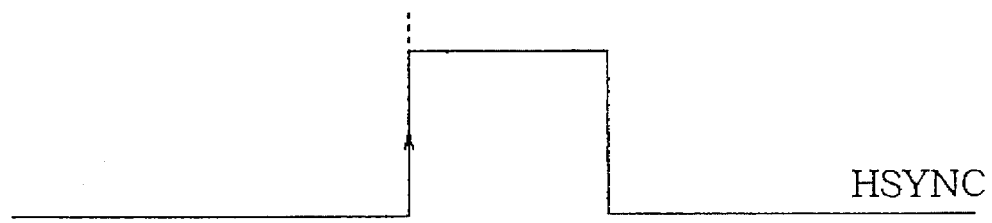
Figure 11A:
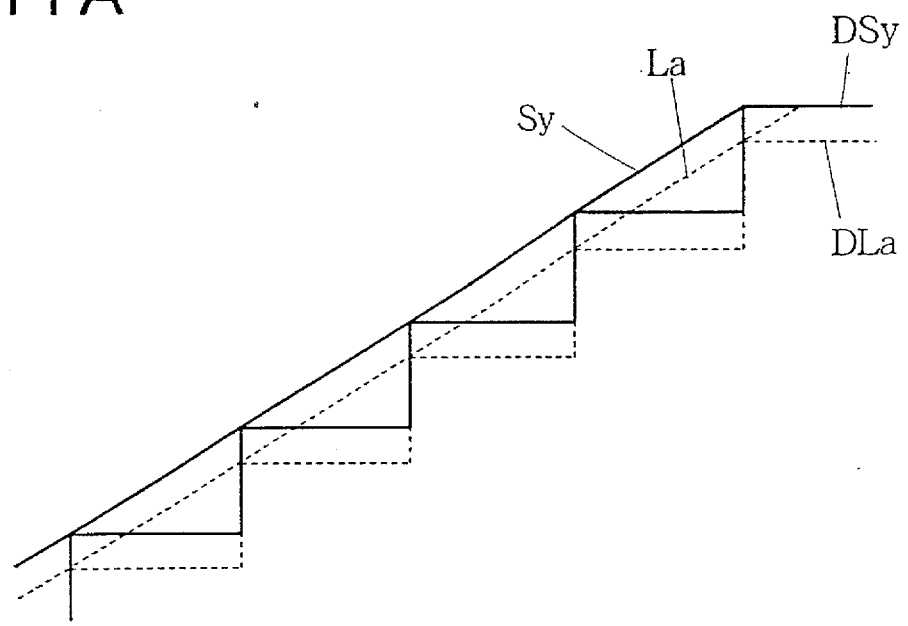
FIG. 11A to FIG. 11C are waveforms diagrams of digital FBP signal, the HSYNC signal and the clock.
Figure 11B:
Figure 11C:

FIG. 10A and FIG. 10B show the phase relationship between HSYNC (FIG. 10B) and the FBP (FIG. 10A). FIG. 11A and FIG. 11B also show the phase relationship between the HSYNC (FIG. 11B) and the digitized value of the FBP (FIG. 11A) in an enlarged scale. FIG. 11C shows the clock pulses controlling the timing of the A/D conversion. It is seen that the analog FBP signals Sy and La are converted at the falling edges of the clock pulses, into digital values DSy and DLa. In FIG. 11A, the value of the digital FBP data is indicated along the vertical axis. It is assumed that the rising slope lasts for 16 clock periods, and the phase error is zero when the midpoint of the rising slope of the FBP coincides with the rising edge of the HSYNC. If there is no error, the FBP is as indicated by the solid line Sy, and the corresponding digital value is as indicated by DSy. If the FBP is lagging, the FBP is, for example, as indicated by broken line La, and the corresponding digital value is as indicated by DLa. The value of the digitized FBP at the rising edge of the HSYNC is smaller if the FBP is lagging. If the FBP is leading, the value of the digitized FBP at the rising edge of the HSYNC is larger. Thus, the value of the digitized FBP at the rising edge of the HSYNC depends on the phase error. By latching the digitized FBP at the rising edge of the HSYNC, therefore, digital data representing the phase error is obtained. Moreover, provided that the number of gray scale levels from the bottom to top of the rising slope of the FBP is larger than the number of clock periods for which the rising slope of the FBP lasts, the phase error can be detected with a resolution finer than one clock period. Specifically, if the number of gray scale levels from the bottom to top of the rising slope is 256 (it is assumed that for the sake of simplicity of explanation that the number of the gray scale levels from the bottom to top of the FBP signal is identical to the full gray scale levels), and the rising slope lasts for 16 clock periods, then the phase error can be detected with a resolution of $16/256=1/16$ clock period. It is to be noted that the latched digital value is the mid value (127) when the phase error is zero, and the latched digital value is smaller or larger than this mid value by the amount corresponding to the amount of the phase error. By subtracting the mid value (127) from the output of the latch circuit 52a, data representing the phase error with a sign indicating whether the FBP is leading or lagging is obtained.

In this way, the phase comparator 52 outputs digital value which ranges from 0 to −128 to +127.

As was described, the integrator 53 integrates the output of the phase comparator 52.

The time constant of integrator 53 can be externally controlled, and if the time constant is set at a large value, the phase following response becomes slower and the time required to reach synchronization of the FBP with the HSYNC is lengthened, but the capability to eliminate jitter is improved.

Conversely, if the time constant is of a smaller value, the phase following response becomes quicker and the time required to reach synchronization of the FBP with the HSYNC is shortened. However the capability to eliminate the jitter is decreased and stability deteriorates.

The integrated phase error data from integrator 53 is input to complement-to-positive number converter 54. The complement-to-positive number conversion is achieved by inverting the MSB of the integrated phase data. The output of the complement-to-positive number conversion is D/A converted at the D/A converter 55, into a voltage signal which is at the middle value (e.g., 2.5 V) if the integrated phase error is zero, and is smaller than the mid value, i.e., between the mid value and the minimum (e.g., 0 V) if the integrated phase error is lagging, and is larger than the mid value, i.e., between the mid value and the maximum (e.g., 5 V) if the integrated phase error is leading.

The output of the D/A converter 17 is supplied as a control voltage to the VCO 11 to control the oscillating frequency of the VCO 11. In this way, the horizontal deflection is maintained in phase with the HSYNC.

It is however noted that, with the above-described arrangement, the desired control function of bringing the phase error toward zero can be achieved only when the phase error is such that the rising edge of the HSYNC is within the period in which the FBP rises. Accordingly some measure to cope with a situation when the phase error is so large and the rising slope does not cover the rising edge of the HSYNC.

Note that the automatic frequency control circuit of this fourth embodiment is for NTSC signals. The operating clock frequency is four times the burst signal frequency (4 Fsc, or approximately 14.318 MHz). The VCO clock center frequency is also 4 Fsc and has a range of variation of ±5%, and the frequency division factor R of the frequency divider 12 is fixed at 910.

Fifth Embodiment

Figure 12:
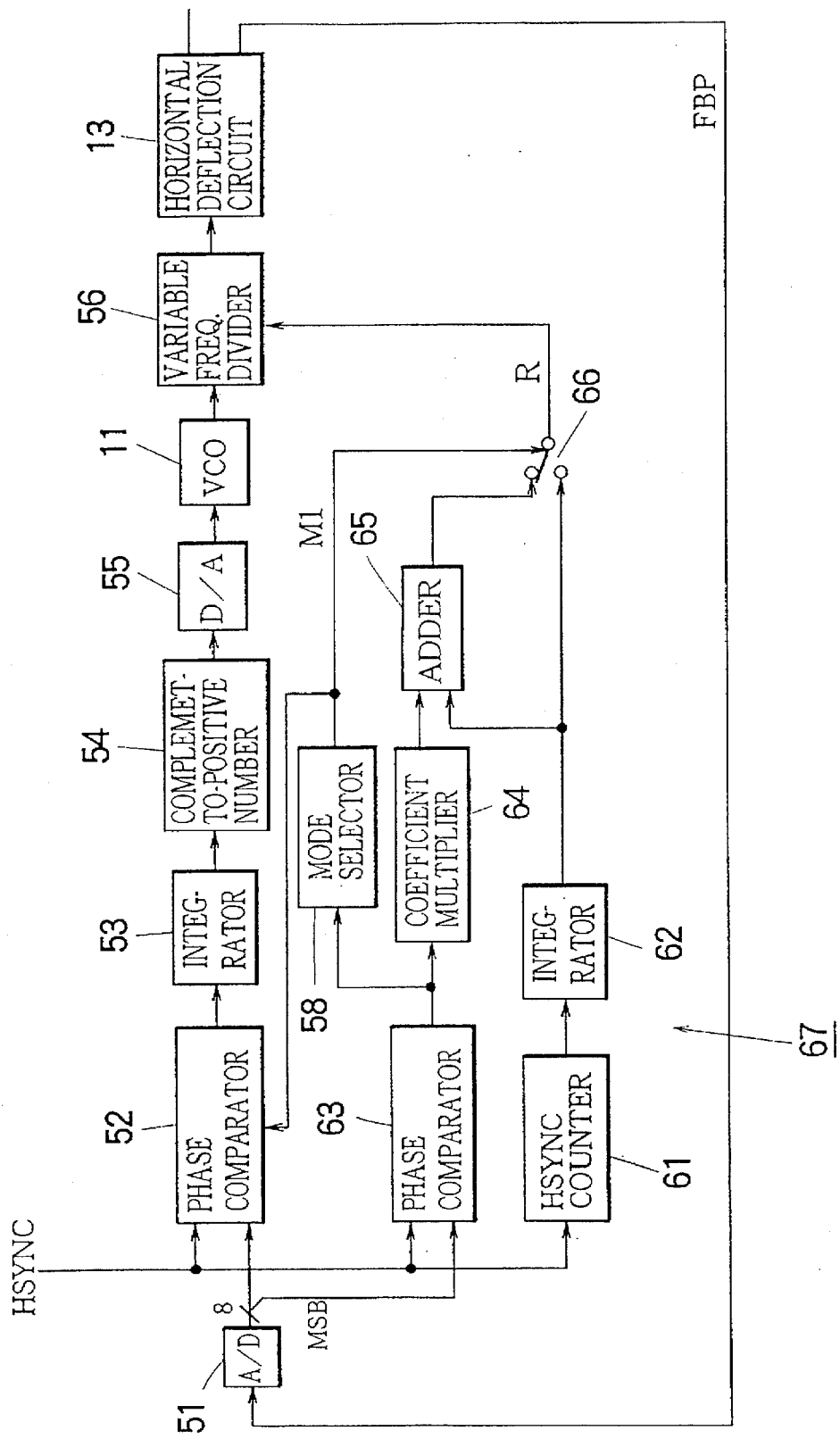
FIG. 12 is a block diagram showing the digital horizontal AFC circuit of a fifth embodiment of this invention.

FIG. 12 is a block diagram showing the digital horizontal AFC circuit according to a fifth embodiment. The illustrated AFC circuit 20D is similar to the AFC circuit 20C in FIG. 9. However, the frequency divider 12 is replaced by a variable frequency divider 56, the frequency division factor R of which can be varied externally. In short, the frequency division factor is reduced when the phase of the FBP is lagging by an amount exceeding a certain threshold, and is increased when the phase of the FBP is leading by an amount exceeding a certain threshold. By such an arrangement, the phase error can be brought to zero more quickly.

The frequency division factor of the variable frequency divider 56 is controlled by a frequency division factor controller 67, which comprises an H sync counter 61, an integrator 62, a phase comparator 63, a mode selector 58, a coefficient multiplier 64, an adder 65, and a selector 66.

The HSYNC counter 61 counts clock pulses during HSYNC period, i.e. for a period between successive HSYNC pulses.

The HSYNC counter 61 outputs its count via the second integrator 62 to the adder 65 and the selector 66.

Although not illustrated as such, the output of the HSYNC counter 61 is also used for detecting occurrence of abnormalities, such as drop-out or noise of the HSYNC input from sync separator 7. When an abnormality occurs, the phase following operation may be terminated, or other processing, such as ignoring the HSYNC noise, may be carried out as required.

The second integrator 62 digitally integrates the count value of the HSYNC counter 61.

The second phase comparator 63 detects the phase difference between the HSYNC signal input from sync separator 7 and the MSB of the digital FBP from the A/D converter 51, with a resolution of the operating clock period. The result of detection of this phase difference is then output as the phase data (hereinafter referred to as the second phase data).

Figure 13:
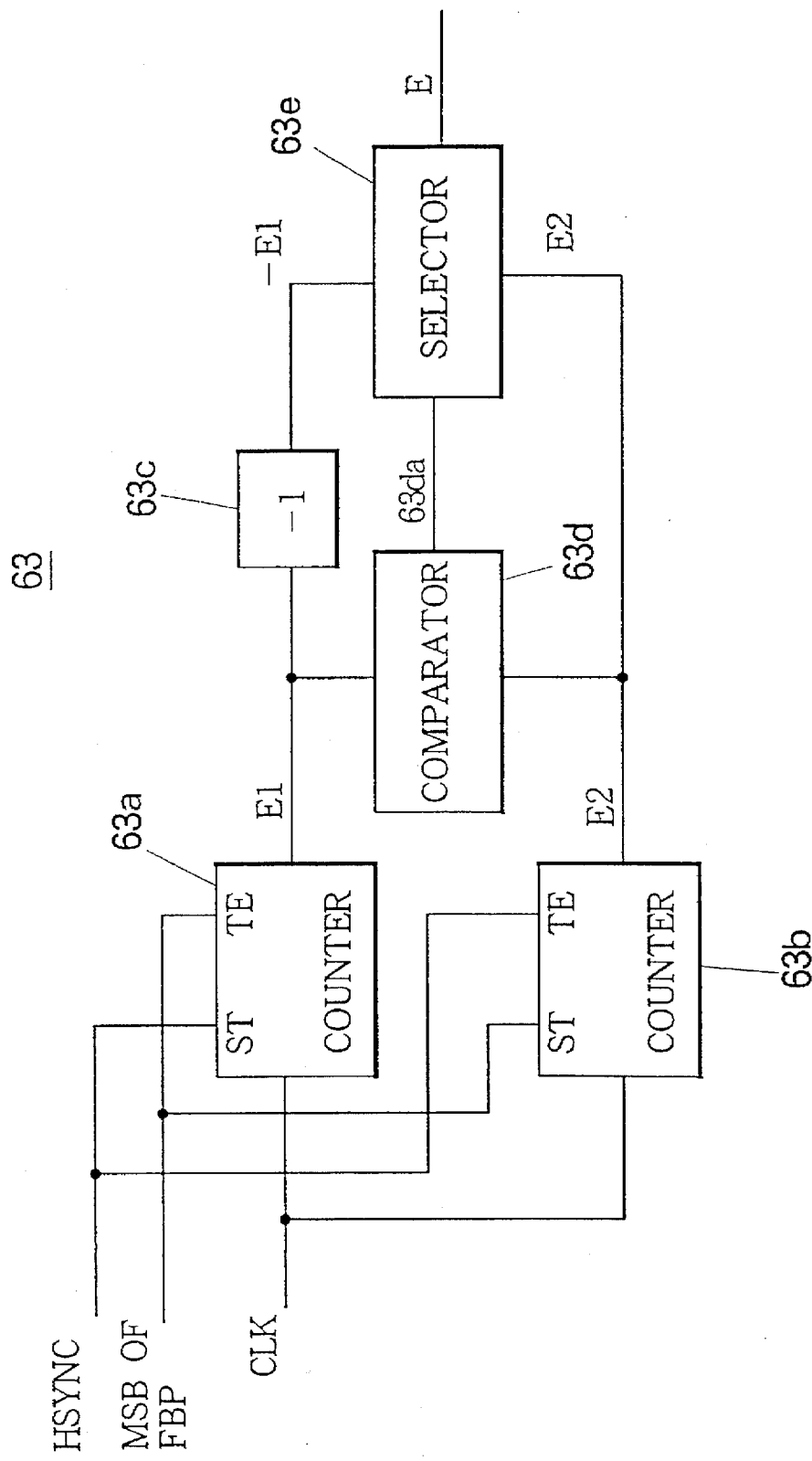
FIG. 13 is a block diagram showing an example of phase comparator 63 in FIG. 12.
Figure 14A:
FIG. 14A to FIG. 14C are waveform diagrams showing the HSYNC signal and the bi-level FBP signal in lagging and leading states.
Figure 14B:
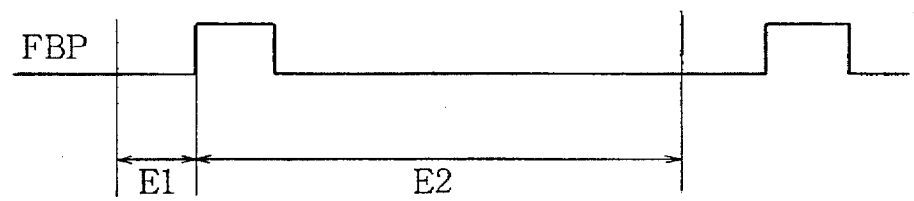
Figure 14C:
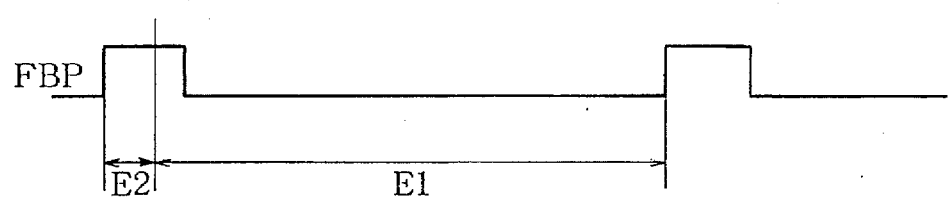

FIG. 13 shows an example of the phase comparator 63. As illustrated, it comprises a first counter 63a, a second counter 63b, a sign inverter 63c, a comparator 63d and a selector 63e. FIG. 14A to FIG. 14C show the phase relationship between the HSYNC and the MSB of the digital FBP. The first counter 63a counts the clock pulses occurring during the period E1 (FIG. 14B and FIG. 14C) from the rising edge of the HSYNC to the succeeding rising edge of the MSB of the digital FBP. The second counter 63b counts the clock pulses occurring during the period E2 (FIG. 14B and FIG. 14C) from rising edge of the MSB of the digital FBP to the succeeding rising edge of the HSYNC. The count values are proportional to the lengths of the periods E1 and D2, so they are also represented by E1 and E2. The sign inverter inverts the sign of the count value E1. The comparator 63d compares the magnitudes of the count values E1 and E2, and outputs a selection control signal 63da which is either of the two values, depending on which of the count values E1 and E2 is smaller than the other. The selector 63e selects the output (−E1) or the count value E2 in accordance with the output of the comparator 63d. Specifically, if the output of the comparator 63d indicates E1<E2, meaning that the FBP is lagging, then the selector 63e selects −E1. If the output of the comparator 63d indicates E2<E1, meaning that the FBP is leading, then the selector 63e selects E2. The output E (=−E1 or E2) of the selector 63e is negative when the FBP is lagging, and positive when the FBP is leading, is output as the second phase data 63P.

The phase comparison is performed every horizontal period, and the second phase data is updated every horizontal period.

The mode selector 58 receives the second phase data from the phase comparator 63 and produces a mode selection signal M1 in accordance with the second phase data. When the value of the second phase data exceeds a reference value (which is "8"), then the mode selection signal M1 is changed to one of two values, e.g., "1" indicating that a "Wide" mode should be selected. When the value of the second phase data is not larger than the reference value (which is "8") consecutively for two or more horizontal periods, then the mode selection signal M1 is changed to the other of the two values, e.g., "0" indicating that a "Narrow" mode should be selected.

When the mode selection signal M1 is "Wide", the phase comparator 52 halts its comparing action so that the control voltage to the VCO 11 is kept unchanged.

The coefficient multiplier 64 multiplies the second phase data from the phase comparator 63 by a coefficient of unity or less and larger than zero (for example, 0.5), and outputs the product to the adder 65. The adder 65 adds the output of the coefficient multiplier 64 to the output of the integrator 62.

The frequency division factor selector 66 has one input terminal connected to the second integrator 62 and the other terminal connected to the adder 65, and selects one of the two inputs in accordance with the mode selection signal Mi. When the mode selection signal M1 indicates "Wide", the selector 66 selects the output of the adder 65. When the mode selection signal M1 indicates "Narrow", the selector 66 selects the output of the integrator 62. The output of the selector 66 is supplied to the variable frequency divider 56, as a signal indicating the frequency division factor R, and is used for controlling the variable frequency divider 56.

As in the Fourth Embodiment, the first phase data is supplied via the first integrator 53, the complement-to-positive number converter 54, and the D/A converter 17, to the VCO 11 to control the oscillating frequency of the VCO 11.

The output of the VCO 11 is frequency-divided by the variable frequency divider 56, in accordance with the frequency division factor R determined by the frequency division factor controller 67.

The combined effect of the control over the oscillating frequency of the VCO 11 and the control over the frequency division factor R of the variable frequency divider 56 is that when the "Narrow" mode is selected, the phase control operation over is effectively similar to that in the Fourth Embodiment.

When the "Wide" mode is selected, the control over the VCO 11 in accordance with the phase error is halted, and the control to eliminate the phase error by varying the frequency division factor R in accordance with the second phase data is effected.

When the phase error of the FBP is within a predefined range, the frequency division factor R is kept unchanged, and the phase error is corrected by changing the oscillating frequency of the VCO 11. When the phase error is outside of the predefined range, the frequency division factor R is altered. That is, when the FBP is lagging by an amount exceeding a threshold value, the frequency division factor R is reduced, to reduce and eliminate the lag. When the FBP is leading by a amount exceeding the threshold, the frequency division factor R is enlarged, to reduce and eliminate the lead.

Note that the automatic frequency control circuit of this Fifth Embodiment, like that of the Fourth Embodiment, is designed for the NTSC signals, the operating clock frequency is four times the burst signal frequency or 4 Fsc, and the VCO clock center frequency is also 4 Fsc. But since in the fifth embodiment, the variable frequency divider 56 is used, the range of variation in the VCO clock frequency can be set smaller than in the fourth embodiment, for example at ±1.25%. and the time constant of the integrator 53 can also be set to a smaller value than in the fourth embodiment. It is therefore possible to improve the response of the automatic frequency control. Moreover, since the two modes of control are selectively adopted depending on the state of the circuit, both the response and stability of the circuit can be improved.

Sixth Embodiment

Figure 15:
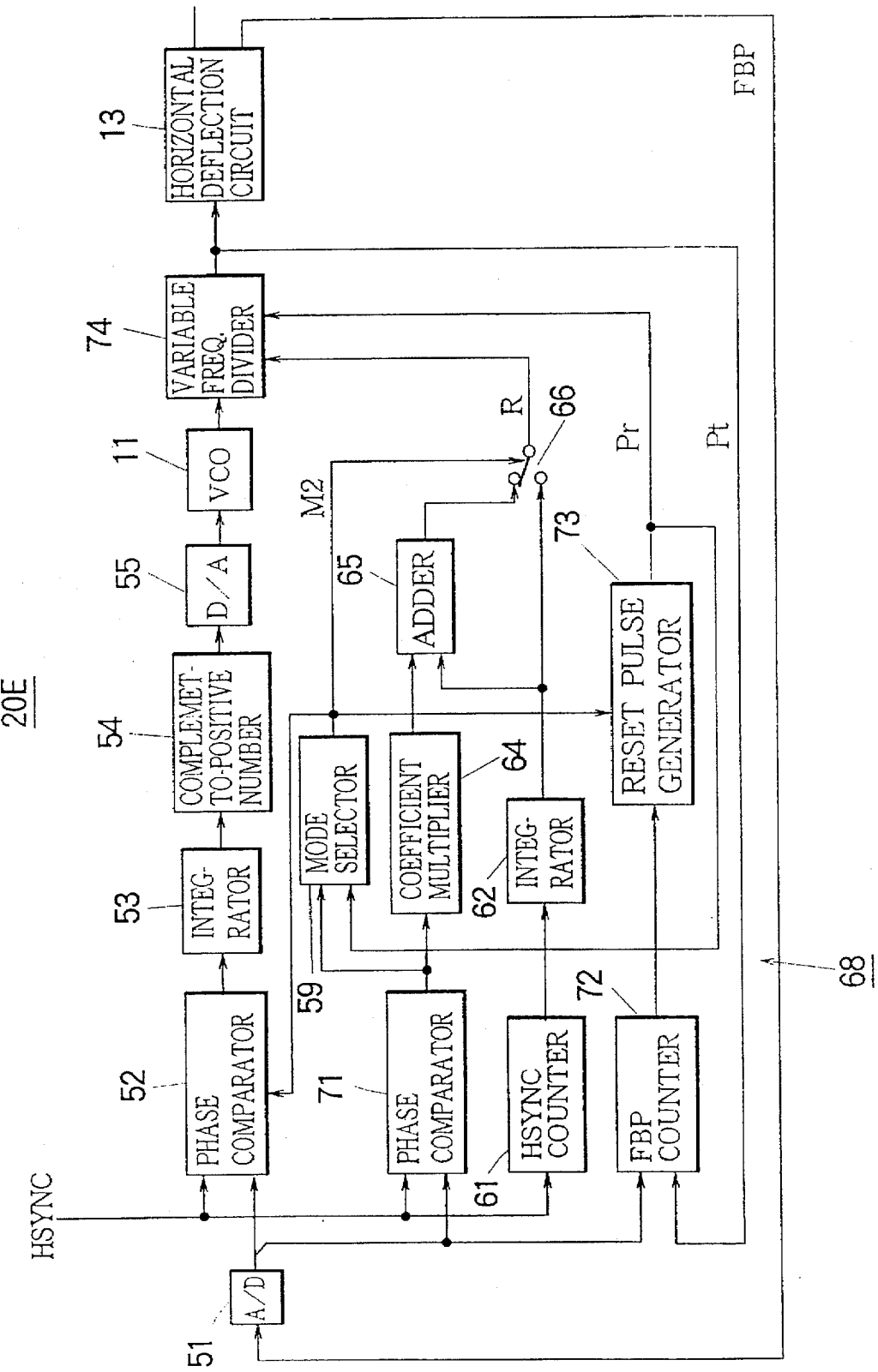
FIG. 15 is a block diagram showing the digital horizontal AFC circuit of a sixth embodiment of this invention.
Figure 16:
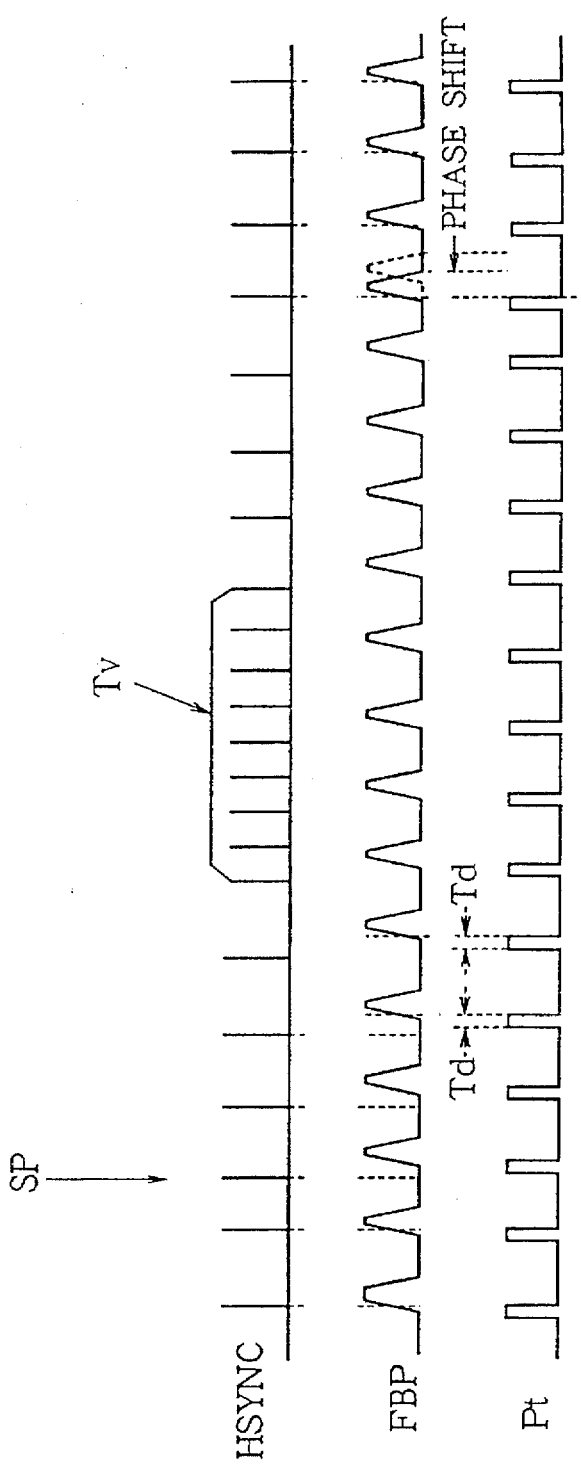
FIG. 16A to FIG. 16D are timing diagrams showing the phase relationship between the HSYNC signal and the FBP signal.

FIG. 15 shows the AFC circuit according to the sixth embodiment of the invention. The illustrated AFC circuit 20E is similar to the AFC circuit 20D in FIG. 12. However, the frequency division factor controller 67 in FIG. 12 is replaced by a frequency division factor controller 68, which is similar to the frequency division factor controller 67 in FIG. 12. However, it additionally comprises an FBP counter 72 and a reset pulse generator 73, and the variable frequency divider 56 in FIG. 12 is replaced by a variable frequency divider 74 with a reset terminal.

In addition, the mode selector 58 in FIG. 12 is replaced by a mode selector 59 outputting a mode selection signal M2. It is similar to the mode selector 58, but when the second phase data output from the phase comparator 71 exceeds a second threshold greater than the threshold mentioned in connection with the mode selector 58 in FIG. 12, e.g. if the second phase data is 16 or more for three or more horizontal clock periods, then the mode selection signal M2 indicates that a "Reset" mode should be selected. The selector 66 is made to select the output of the adder 65 when the mode selection signal M2 indicates "Wide" or "Reset", and the output of the integrator 62 when the mode selection signal M2 indicates "Narrow" mode.

The FBP counter 72 counts the clock pulses occurring during the period from the rising edge of a trigger pulse Pt to the horizontal deflection circuit 13 to the rising edge of the MSB of the digital FBP, to thereby measure the delay time Td of the latter with respect to the former.

The reset pulse generator 73 receives the count value of the FBP counter 72, and the mode selection signal M2 from the mode selector 59. In "Reset" mode, the reset pulse generator 73 outputs a reset pulse Pr having a phase leading the rising edge of the HSYNC by an amount corresponding to Td. The reset pulse generator 73 operates only in the "Reset" mode, and is inoperative in the "Wide" and "Narrow" modes.

When the reset pulse Pr is supplied from the reset pulse generator 73, the variable frequency divider 74 with the reset terminal output a trigger pulse Pt promptly, and thereafter periodically at the interval equal to the horizontal period. In other respect, the variable frequency divider 74 is similar in configuration and operation to the variable frequency divider 56 of the Sixth Embodiment.

FIG. 16A to FIG. 16D are timing diagrams showing the phase relationship between the HSYNC and the FBP in the horizontal AFC circuit 20E. It is assumed that phase of the HSYNC is changed abruptly, while the frequency of the HSYNC is maintained constant. In such a situation, the reset pulse generator 73 causes the FBP to promptly follow the phase change of the HSYNC after the subsequent vertical blanking period.

Such an abrupt change in the phase of the HSYNC can occur when the video signal is a playback signal from a VTR (video tape recorder). It is seen that the phase of the HSYNC is changed at a switching point SP. That is, before the switching point SP, the FBP is in synchronism with the HSYNC, so that the mode selection signal M2 indicates "Narrow". After the switching point SP, the FBP is lagging by Td. However, during the period from the switching point SP to the end of the vertical blanking period Tv, the phase following operation of the AFC circuit 20E is halted, and the phase error voltage and the frequency division factor R are unchanged. Accordingly, the frequency of the FBP is identical with the frequency of the HSYNC, but the phase of the FBP is different from the phase of the HSYNC.

If the vertical period Tv ends in this condition, the horizontal AFC circuit 20E goes into the "Reset" mode, and the reset pulse Pr is supplied to the reset terminal of the variable frequency divider 74. The trigger pulse Pt is therefore supplied from the variable frequency divider 74 to the horizontal deflection circuit 13. The trigger pulse Pt is made to lead in phase the rising edge of the HSYNC by an amount corresponding to the delay time Td. Since the the FBP lags behind the trigger pulse Pt by the delay time Td, the result is that the phases of HSYNC and FBP will substantially match after the resetting.

When the reset pulse Pr is generated, the mode selection signal M2 is changed from "Reset" to "Wide" When the mode selection signal M2 is "Reset" or "Wide", the phase comparator 52 halts its action so that the control voltage to the VCO 11 is kept unchanged.

In the horizontal AFC circuit 20E described above, like that of the fifth embodiment, when "Narrow" mode is selected, the oscillating frequency of the VCO 11 is controlled in accordance with the phase error of the FBP. When the "Wide" mode is selected, the phase control by means of the VCO 11 on the basis of the phase error is halted, and instead the frequency division factor control on the basis of the second phase data is effected. When the "Reset" mode is selected, the frequency division factor control is also halted, and the frequency divider 74 is reset to change the phase of the FBP only. In this way, the phase error can be promptly reduced.

Seventh Embodiment

Figure 17:
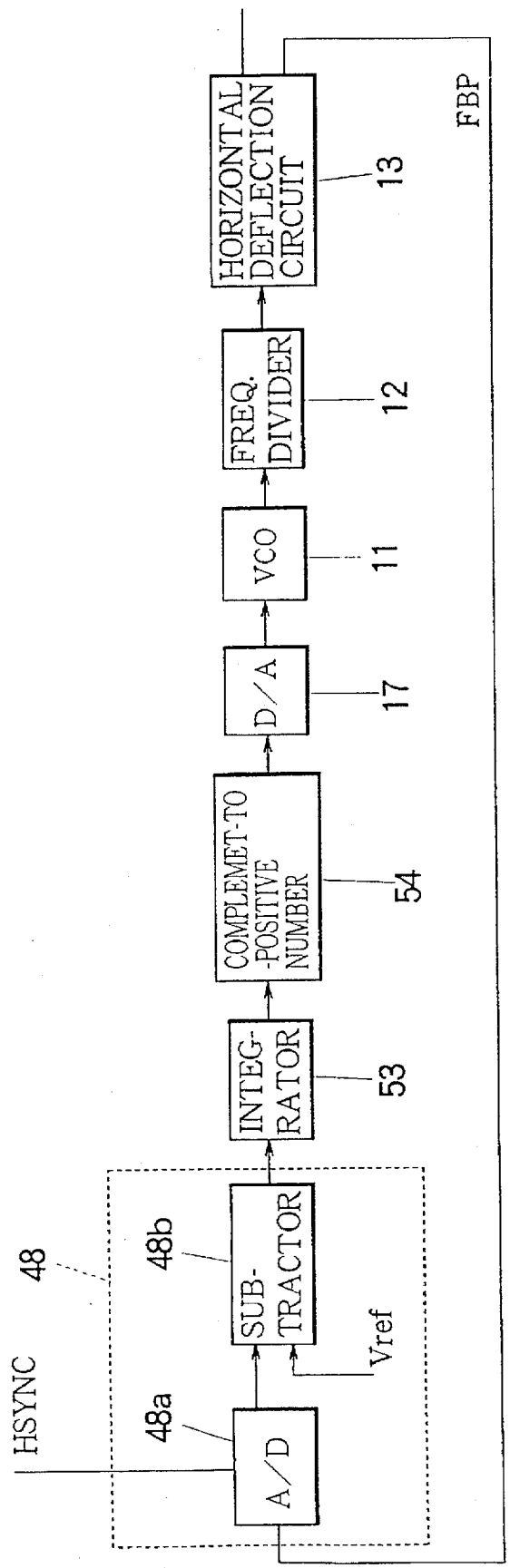
FIG. 17 is a block diagram showing the digital horizontal AFC circuit of a seventh embodiment of this invention.

FIG. 17 is a block diagram showing the digital horizontal AFC circuit according to a seventh embodiment. The illustrated AFC circuit 20F is similar to the AFC circuit 20C in FIG. 9. The difference is that the combination of the A/D converter 51 and the phase comparator 52 is replaced by a phase comparator 48. As illustrated, the phase comparator 48 of this embodiment comprises an A/D converter 48a converting the FBP from the horizontal deflection circuit 13, at the rising edge of the HSYNC and a subtractor 48b subtracting a reference value Vref (e.g., 127) from the output Po of the A/D converter 48a to produce the difference (Po−Vref).

The value obtained by the A/D conversion indicates the phase error of the FBP with respect to the HSYNC. This will be explained with reference to FIG. 10A and FIG. 10B show the phase relationship between HSYNC (FIG. 10B) and the FBP (FIG. 10A). It is assumed that the rising slope lasts for 16 clock periods, and the phase error is zero when the midpoint of the rising slope of the FBP coincides with the rising edge of the HSYNC. If there is no error, the FBP is as indicated by the line Sy. If the FBP is lagging, the FBP is as indicated by line La, for example. The value of the FBP at the rising edge of the HSYNC is smaller if the FBP is lagging. If the FBP is leading, the value of the FBP at the rising edge of the HSYNC is larger. Thus, the value of the FBP depends on the phase error. By digitizing the FBP at the rising edge of the HSYNC, therefore, digital data representing the phase error is obtained. Moreover, provided that the number of gray scale levels from the bottom to top of the rising slope of the FBP is larger than the number of clock periods for which the rising slope of the FBP lasts, the phase error can be detected with a resolution finer than one clock period. Specifically, if the number of gray scale levels from the bottom to top of the rising slope is 256, and the rising slope lasts for 16 clock periods, then the phase error can be detected with a resolution of $16/256=1/16$ clock period. It is to be noted that the digital value is the mid value (127) when the phase error is zero, and the digital value is smaller or larger than this mid value by the amount corresponding to the amount of the phase error. By subtracting the mid value (127) from the output of the A/D converter, data representing the phase error with a sign indicating whether the FBP is leading or lagging is obtained.

In this way, the phase comparator 48 outputs digital value which ranges from 0 to −128 to +127.

The rest of the configuration and operation is similar to that described with reference to the Fourth Embodiment.

Eighth Embodiment

Figure 18:
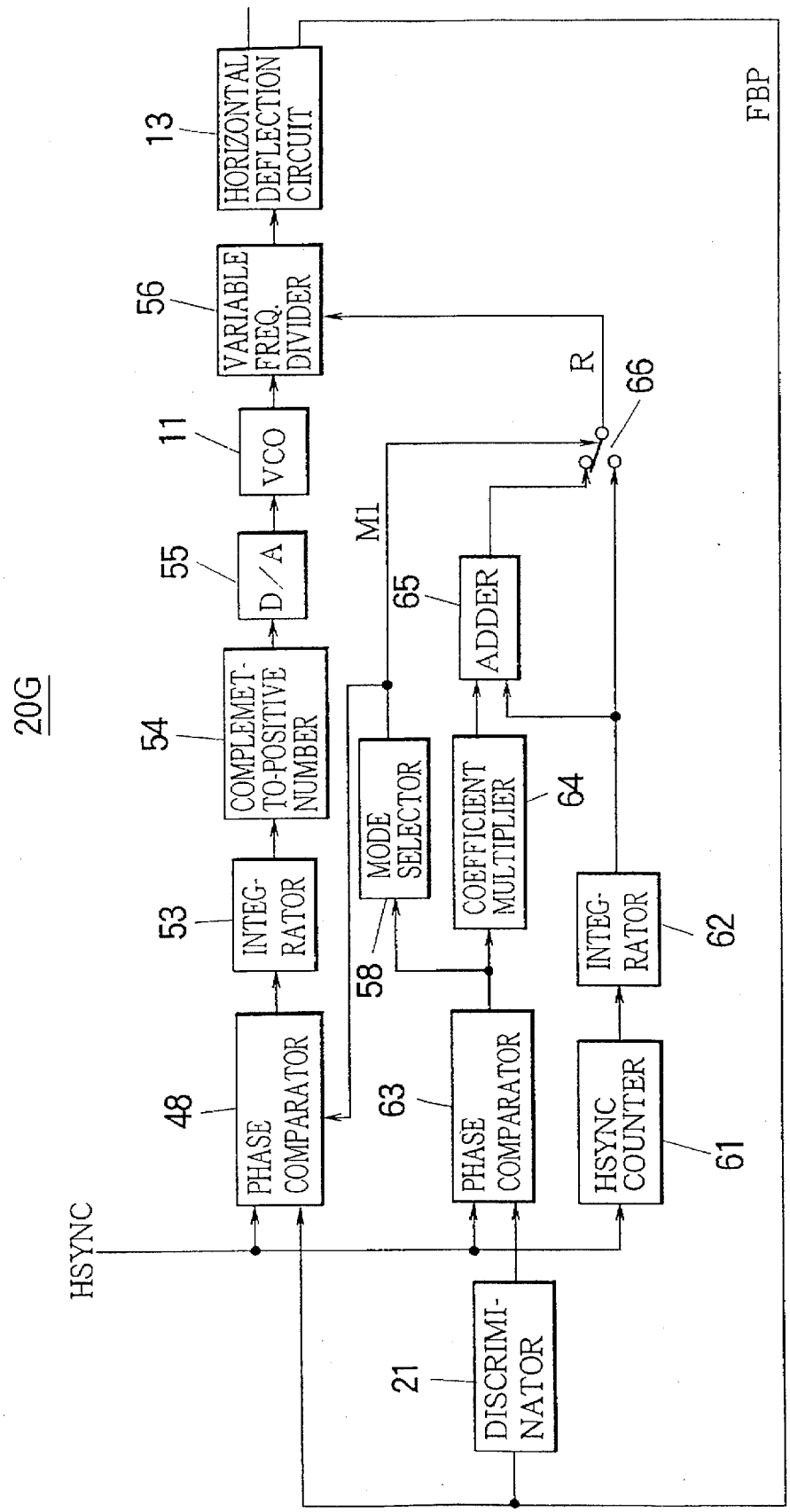
FIG. 18 is a block diagram showing the digital horizontal AFC circuit of an eighth embodiment of this invention.

FIG. 18 is a block diagram showing the digital horizontal AFC circuit according to an eighth embodiment. The illustrated AFC circuit 20G is similar to the AFC circuit 20D in FIG. 12. However, the A/D converter 51 and the phase comparator 52 are eliminated, and instead, the phase comparator 48 similar to that described in connection with the embodiment of FIG. 17 and a discriminator 21 similar to that described in connection with the embodiment of FIG. 1 is used. The discriminator 21 generates a bi-level FBP signal which is High when the level of the FBP is above a certain threshold, which is set to be equal for example to the mid value (127) of the range of variation of the FBP level, so that the output of the discriminator 21 corresponds to the MSB of the output of the A/D converter 51 in FIG. 12.

The rest of the configuration and operation of the embodiment of FIG. 18 are similar to those of the embodiment of FIG. 12.

Features described with reference to the embodiment of FIG. 15 can be also added to the Embodiment of FIG. 18.

In the Fourth to Eighth embodiments, the phase error is such that the rising edge of the HSYNC is within the period in which the FBP rises. It may alternatively so arranged that the phase error is such that the rising edge of the HSYNC is within the period in which the FBP falls.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An automatic frequency control circuit for synchronizing a horizontal deflection current of a television receiver with a horizontal sync signal, with a flyback pulse being produced in synchronism with said horizontal deflection current, said automatic frequency control circuit comprising:

a voltage-controlled oscillator producing clock pulses;

frequency divider frequency-dividing the output of said voltage-controlled oscillator;

said horizontal deflection current being produced in accordance with the output of said frequency divider;

digital signal producing means for producing first digital phase data from the flyback pulse at a rising or falling edge of the horizontal sync signal;

a first integrator integrating said first digital phase data to produce a first integrated phase data;

a complement-to-positive number converter converting an output of said first integrator to produce a digital signal representing a positive number corresponding to said integrated phase data; and a D/A converter converting the digital signal from said complement-to-positive number converter into a corresponding first integrated phase error voltage signal;

a frequency of said clock pulses produced by said voltage-controlled oscillator being controlled in accordance with said first integrated phase error voltage signal.

2. The automatic frequency control circuit according to claim 1, wherein said frequency divider comprises a variable frequency divider having a variable frequency division factor; and said automatic frequency control circuit further comprises a frequency division factor control circuit varying the frequency division factor in accordance with a phase error of the flyback pulse with respect to the horizontal sync signal.

3. The automatic frequency control circuit according to claim 2, wherein said frequency division factor control circuit comprises:

a horizontal sync period counter counting clock pulses for a horizontal sync period;

a second integrator integrating the count of the horizontal sync period counter to produce an integrated count data;

means responsive to the flyback pulse for producing a bi-level signal according to whether the flyback pulse is or is not above a threshold value;

a phase comparator for detecting a phase difference between said horizontal sync signal and said bi-level signal to produce second phase data;

a coefficient multiplier multiplying the second phase data by a coefficient which is not larger than unity and which is larger than zero;

an adder adding the output of the coefficient multiplier to the output of said second integrator;

a mode selector selecting a Narrow mode when the second phase data is smaller than a certain threshold value, and a Wide mode when the second phase data is larger than the certain threshold value;

a selector selecting the output of the second integrator when the mode selector selects the Narrow mode, and selecting the output of the adder when the mode selector selects the Wide mode, and outputting a selected signal as a frequency division control signal to the variable frequency divider.

4. The automatic frequency control circuit according to claim 3, wherein said variable frequency divider is resettable responsive to a reset pulse externally supplied;

said frequency division factor control circuit further comprises a second counter for counting the clock pulses during a period of from a horizontal deflection trigger pulse to an edge of said bi-level signal to thereby measure a flyback pulse delay time;

a reset pulse generator applying said reset pulse to said variable frequency divider immediately after an end of a vertical blanking period, if said second phase data is larger than a second threshold, wherein said second threshold is larger than said certain threshold value.

5. An automatic frequency control method for synchronizing a horizontal deflection current of a television receiver with a horizontal sync signal, with a flyback pulse being produced in synchronism with said horizontal deflection current, said automatic frequency control method comprising the steps of:

producing clock pulses with a voltage-controlled oscillator;

frequency-dividing the clock pulses;

producing the horizontal deflection current in accordance with the frequency-divided clock pulses;

producing first digital phase data from the flyback pulse at a rising or falling edge of the horizontal sync signal;

integrating the first digital phase data to produce a first integrated phase data;

converting the first integrated phase data to produce a digital signal representing a positive number corresponding to the first integrated phase data; and converting the digital signal from said step of converting the first integrated phase data into a corresponding first integrated phase error voltage signal;

controlling a frequency of the clock pulses produced by the voltage-controlled oscillator in accordance with the first integrated phase error voltage signal.

6. The automatic frequency control method according to claim 5, wherein said frequency dividing step further includes the substep of varying the frequency of the clock pulses according to a variable frequency division factor; and said automatic frequency control method further comprises the step of varying the frequency division factor in accordance with a phase error of the flyback pulse with respect to the horizontal sync signal.

7. The automatic frequency control method according to claim 6, wherein said step of varying the frequency division factor includes the substeps of:

counting clock pulses for a horizontal sync period;

a second integrating step for integrating the count of the horizontal sync period to produce an integrated count data;

producing a bi-level signal according to whether the flyback pulse is or is not above a threshold value;

detecting a phase difference between the horizontal sync signal and the bi-level signal to produce second phase data;

multiplying the second phase data by a coefficient which is not larger than unity and which is larger than zero;

adding the multiplied phase data to the integrated count data;

selecting a Narrow mode when the second phase data is smaller than a certain threshold value, and a Wide mode when the second phase data is larger than the certain threshold value;

selecting the integrated count data when the Narrow mode is selected;

selecting the output of said adding step when the Wide mode is selected; and outputting a selected signal as the frequency division factor to the substep of varying the frequency of the clock pulses.

8. The automatic frequency control method according to claim 7, wherein said substep of varying the frequency of the clock pulses being resettable responsive to a reset pulse externally supplied;

said step of varying the frequency division factor further includes:

a second counting step for counting the clock pulses during a period of from a horizontal deflection trigger pulse to an edge of the bi-level signal to thereby measure a flyback pulse delay time;

a reset pulse generating step for applying the reset pulse to said substep of varying the frequency of the clock pulses immediately after an end of a vertical blanking period, if the second phase data is larger than a second threshold, wherein the second threshold is larger than said certain threshold value.

\* \* \* \* \*